US008314653B1

(12) United States Patent
Granger-Jones et al.

(10) Patent No.: US 8,314,653 B1
(45) Date of Patent: Nov. 20, 2012

(54) USING DEGENERATION IN AN ACTIVE TUNABLE LOW-NOISE RADIO FREQUENCY BANDPASS FILTER

(75) Inventors: Marcus Granger-Jones, Scotts Valley, CA (US); Nadim Khlat, Midi-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 352 days.

(21) Appl. No.: 12/708,310

(22) Filed: Feb. 18, 2010

Related U.S. Application Data

(60) Provisional application No. 61/153,462, filed on Feb. 18, 2009.

(51) Int. Cl.
  H03K 5/00 (2006.01)
  H04B 1/10 (2006.01)
(52) U.S. Cl. .................... 327/553; 327/552; 455/307
(58) Field of Classification Search .......... 327/551–559; 455/307, 333
  See application file for complete search history.

(56) References Cited

U.S. PATENT DOCUMENTS

| | | | | |
|---|---|---|---|---|
| 5,267,234 A * | 11/1993 | Harrison | ...................... | 370/281 |
| 6,681,103 B1 * | 1/2004 | Rogers et al. | ................. | 455/302 |
| 7,646,252 B2 * | 1/2010 | Banba | ........................... | 330/311 |
| 7,672,657 B2 * | 3/2010 | Cowley et al. | ................. | 455/307 |
| 7,786,806 B2 * | 8/2010 | Duperray | ..................... | 330/311 |

OTHER PUBLICATIONS

Baki, R.A. et al., "A 1.5V multigigahertz CMOS tunable image reject notch filter," The 14th International Conference on Microelectronics 2002—ICM, Dec. 11-13, 2002, pp. 144-147, IEEE.

Chi, Bayong et al., "A Superheterodyne Receiver Front-End With On-Chip Automatically Q-Tuned Notch Filters," Radio Frequency Integrated Circuits (RFIC) Symposium, Jun. 3-5, 2007, pp. 21-24, IEEE.

Darabi, H., "A Blocker Filtering Technique for SAW-Less Wireless Receivers," IEEE Journal of Solid-State Circuits, Dec. 2007, pp. 2766-2773, vol. 42, No. 12, IEEE.

Mikhemar, M. et al., "A tunable integrated duplexer with 50dB isolation in 40nm CMOS," Solid-State Circuits Conference—Digest of Technical Papers, Feb. 8-12, 2009, pp. 386-387,387a, IEEE.

Soer, M. et al., "A 0.2-to-2.0GHz 65nm CMOS receiver without LNA achieving >>11dBm IIP3 and <<6.5 dB NF," Solid-State Circuits Conference—Digest of Technical Papers, Feb. 8-12, 2009, pp. 222-223,223a, IEEE.

Song, Hang et al., "A CMOS adaptive antenna-impedance-tuning IC operating in the 850MHz-to-2GHz band," Solid-State Circuits Conference—Digest of Technical Papers, Feb. 8-12, 2009, pp. 384-385,385a, IEEE.

(Continued)

*Primary Examiner* — Dinh T. Le
(74) *Attorney, Agent, or Firm* — Withrow & Terranova, P.L.L.C.

(57) ABSTRACT

The present disclosure relates to a first active tunable low-noise RF bandpass filter that includes at least a first transistor element and a tunable frequency selective degeneration circuit coupled to a first non-inverting output of the first transistor element. The first active tunable low-noise RF bandpass filter combines low noise amplifier (LNA) and tunable bandpass filter functionalities into a single active RF bandpass filter. The tunable frequency selective degeneration circuit uses degeneration at frequencies outside of a passband of the active RF bandpass filter to increase feedback, thereby decreasing gain of the active RF bandpass filter. By decreasing the gain, linearity of the active RF bandpass filter may be improved in the presence of strong interfering RF signals, thereby enabling elimination of passive bandpass filter elements, such as surface acoustic wave (SAW) and bulk acoustic wave (BAW) filters, without degrading reception of in-band RF signals.

27 Claims, 15 Drawing Sheets

OTHER PUBLICATIONS

Sowlati, T. et al., "Single-chip multiband WCDMA/HSDPA/HSUPA/EGPRS transceiver with diversity receiver and 3G DigRF interface without SAW filters in transmitter / 3G receiver paths," Solid-State Circuits Conference—Digest of Technical Papers, Feb. 8-12, 2009, pp. 116-117,117a, IEEE.

Tenbroek, B. et al., "Single-Chip Tri-Band WCDMA/HSDPA Transceiver without External SAW Filters and with Integrated TX Power Control," Solid-State Circuits Conference, Digest of Technical Papers, Feb. 3-7, 2008, pp. 202-203, 607, IEEE.

* cited by examiner

USING DEGENERATION IN AN ACTIVE TUNABLE LOW-NOISE RADIO FREQUENCY BANDPASS FILTER

This application claims the benefit of provisional patent application Ser. No. 61/153,462, filed Feb. 18, 2009, the disclosure of which is hereby incorporated herein by reference in its entirety.

FIELD OF THE DISCLOSURE

Embodiments of the present disclosure relate to low noise amplifiers (LNAs) and bandpass filters, which may be used in radio frequency (RF) communications systems.

BACKGROUND OF THE DISCLOSURE

As wireless technology evolves, the number and variations of wireless communications protocols increase and may encompass multiple operating modes, including half-duplex modes, full duplex modes, multiple frequency bands, and various transmit power levels. As a result, wireless communications products may need to provide support for many such protocols and frequency bands. Tens of frequency bands may need to be supported, such that a receive path for each frequency band may have a dedicated surface acoustic wave (SAW) or bulk acoustic wave (BAW) bandpass filter. Therefore, a wireless communications product may have tens of SAW or BAW filters, which tend to be expensive and relatively large. Further, as semiconductor integration technologies evolve, wireless communications products are moving toward integrating as much functionality as possible on a single semiconductor die. Such a die may be called a system on a chip (SoC). As a result, tens of sets of receive connections may be required between receive circuits on an RF front end module and filtering and down conversion circuitry in an SoC. Such receive connections may occupy a significant portion of layout areas and may present challenges in keeping RF signals isolated from digital signals. Thus, there is a need for an RF front end module that can reduce or eliminate SAW and BAW filters and can reduce the number of receive connections between the RF front end module and the SoC.

SUMMARY OF THE EMBODIMENTS

The present disclosure relates to a first active tunable low-noise RF bandpass filter that includes at least a first transistor element and a tunable frequency selective degeneration circuit coupled to a first non-inverting output of the first transistor element. The first active tunable low-noise RF bandpass filter combines low noise amplifier (LNA) and tunable bandpass filter functionalities into a single active RF bandpass filter. The tunable frequency selective degeneration circuit uses degeneration at frequencies outside of a passband of the active RF bandpass filter to increase feedback, thereby decreasing gain of the active RF bandpass filter. By decreasing the gain, linearity of the active RF bandpass filter may be improved in the presence of strong interfering RF signals, thereby enabling elimination of passive bandpass filter elements, such as surface acoustic wave (SAW) and bulk acoustic wave (BAW) filters, without degrading reception of in-band RF signals. Further, since the first active tunable low-noise RF bandpass filter is tunable, a center frequency of the passband may be tuned based on a degeneration tuning signal, thereby enabling reduction of a quantity of receive paths needed in a multi-band RF front end module. By eliminating receive paths, a number of switch positions in an RF front end may be reduced, thereby leading to lower front end insertion loss, improved receiver sensitivity, improved transmit path efficiencies, smaller size, lower cost, or any combination thereof.

Some embodiments of the first active tunable low-noise RF bandpass filter may use a cascode transistor structure and may include a tunable low-side notch filter, a tunable high-side notch filter, or both to provide good attenuation of one or more close-in RF interfering signals. An asymmetrical impedance response of the tunable frequency selective degeneration circuit may provide the tunable low-side notch filter. Alternatively, a cascode low-side notch filter circuit may be coupled to an inverting output of the first transistor element to provide the tunable low-side notch filter. The first active tunable low-noise RF bandpass filter may include a tunable load circuit that provides additional tunable bandpass filter functionality to the first active tunable low-noise RF bandpass filter. Further, the tunable load circuit may include a high-side notch filter circuit to provide the tunable high-side notch filter. Alternatively, a cascode high-side notch filter circuit may be coupled to the inverting output of the first transistor element to provide the tunable high-side notch filter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
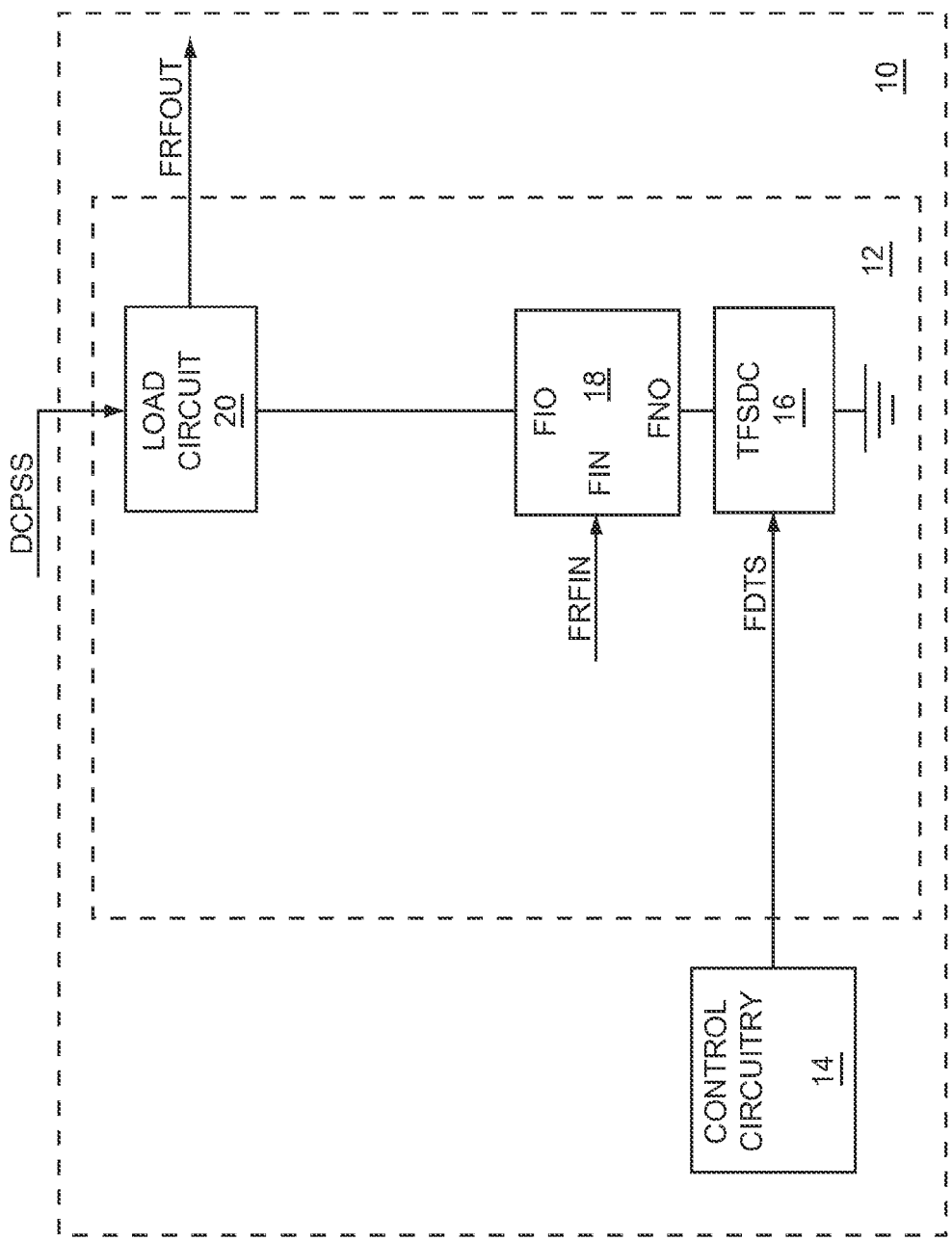
FIG. 1 shows RF front end circuitry according to one embodiment of the RF front end circuitry.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a first active tunable low-noise RF bandpass filter that includes at least a first transistor element and a tunable frequency selective degeneration circuit coupled to a first non-inverting output of the first transistor element. The first active tunable low-noise RF bandpass filter combines low noise amplifier (LNA) and tunable bandpass filter functionalities into a single active RF bandpass filter. The tunable frequency selective degeneration circuit uses degeneration at frequencies outside of a passband of the active RF bandpass filter to increase feedback, thereby decreasing gain of the active RF bandpass filter. By decreasing the gain, linearity of the active RF bandpass filter may be improved in the presence of strong interfering RF signals, thereby enabling elimination of passive bandpass filter elements, such as surface acoustic wave (SAW) and bulk acoustic wave (BAW) filters, without degrading reception of in-band RF signals. Further, since the first active tunable low-noise RF bandpass filter is tunable, a center frequency of the passband may be tuned based on a degeneration tuning signal, thereby enabling reduction of a quantity of receive paths needed in a multi-band RF front end module. By eliminating receive paths, a number of switch positions in an RF front end may be reduced, thereby leading to lower front end insertion loss, improved receiver sensitivity, improved transmit path efficiencies, smaller size, lower cost, or any combination thereof.

Some embodiments of the first active tunable low-noise RF bandpass filter may use a cascode transistor structure and may include a tunable low-side notch filter, a tunable high-side notch filter, or both to provide good attenuation of one or more close-in RF interfering signals. An asymmetrical impedance response of the tunable frequency selective degeneration circuit may provide the tunable low-side notch filter. Alternatively, a cascode low-side notch filter circuit may be coupled to an inverting output of the first transistor element to provide the tunable low-side notch filter. The first active tunable low-noise RF bandpass filter may include a tunable load circuit that provides additional tunable bandpass filter functionality to the first active tunable low-noise RF bandpass filter. Further, the tunable load circuit may include a high-side notch filter circuit to provide the tunable high-side notch filter. Alternatively, a cascode high-side notch filter circuit may be coupled to the inverting output of the first transistor element to provide the tunable high-side notch filter.

FIG. 1 shows RF front end circuitry 10 according to one embodiment of the RF front end circuitry 10. The RF front end circuitry 10 includes a first active tunable low-noise RF bandpass filter 12 and control circuitry 14. The first active tunable low-noise RF bandpass filter 12 includes a tunable frequency selective degeneration circuit 16, a first transistor element 18, and a load circuit 20. The tunable frequency selective degeneration circuit 16 is coupled to a first non-inverting output FNO of the first transistor element 18. The first RF input signal FRFIN feeds a first input FIN of the first transistor element 18. The load circuit 20 is coupled to a first inverting output FIO of the first transistor element 18. The control circuitry 14 provides a first degeneration tuning signal FDTS to the tunable frequency selective degeneration circuit 16, which is coupled to ground. The load circuit 20 receives a DC power supply signal DCPSS and provides a first RF output signal FRFOUT.

Figure 2:
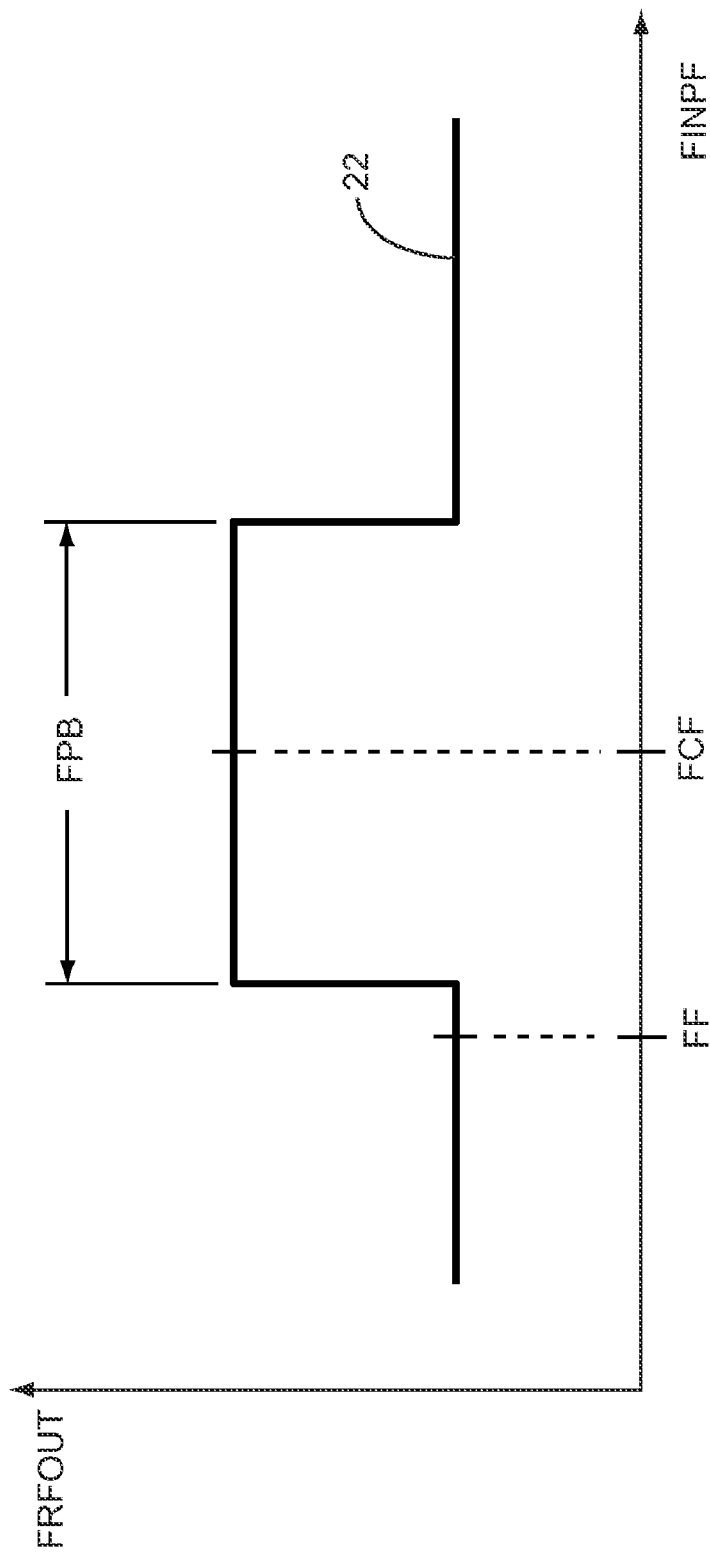
FIG. 2 is a graph showing a frequency response curve of a first active tunable low-noise RF bandpass filter illustrated in FIG. 1 according to one embodiment of the first active tunable low-noise RF bandpass filter.

FIG. 2 is a graph showing a first frequency response curve 22 of the first active tunable low-noise RF bandpass filter 12 illustrated in FIG. 1 according to one embodiment of the first active tunable low-noise RF bandpass filter 12. The horizontal axis shows a first input frequency FINPF of the first RF input signal FRFIN and the vertical axis shows a magnitude of the first RF output signal FRFOUT. During operation of the first active tunable low-noise RF bandpass filter 12, the first active tunable low-noise RF bandpass filter 12 receives, amplifies, and filters the first RF input signal FRFIN to provide the first RF output signal FRFOUT. The first active tunable low-noise RF bandpass filter 12 has a first passband FPB, such that a first center frequency FCF of the first passband FPB is based on the first degeneration tuning signal FDTS. At the first center frequency FCF, the tunable frequency selective degeneration circuit 16 presents a first impedance to the first non-inverting output FNO based on the first degeneration tuning signal FDTS. At a first frequency FF, which is outside of the first passband FPB, the tunable frequency selective degeneration circuit 16 presents a second impedance to the first non-inverting output FNO based on the first degeneration tuning signal FDTS. The second impedance is greater than the first impedance. The first frequency response curve 22 is representative of a typical bandpass filter response curve. As such, the first frequency FF may be representative of a first interfering RF signal and the first center frequency FCF may be representative of a desired received RF signal. The first frequency FF illustrated in FIG. 2 is indicative of a frequency that is less than frequencies of the first passband FPB. Alternatively, the first frequency FF may be of a frequency that is greater than frequencies of the first passband FPB.

An impedance response of the tunable frequency selective degeneration circuit 16 is responsible for the first frequency response curve 22 illustrated in FIG. 2. Frequency selective degeneration means degeneration only at frequencies outside of the passband. An impedance presented by the tunable frequency selective degeneration circuit 16 provides feedback to the first transistor element 18. Degeneration at frequencies outside of the first passband FPB causes a high impedance to be presented to the first non-inverting output FNO, which provides high feedback to the first transistor element 18, thereby reducing gain of the first active tunable low-noise RF bandpass filter 12. Conversely, frequencies inside of the first passband FPB do not cause degeneration. As such, the tunable frequency selective degeneration circuit 16 presents a low impedance to the first non-inverting output FNO, which provides low feedback to the first transistor element 18, thereby increasing gain of the first active tunable low-noise RF bandpass filter 12. For example, in an exemplary embodiment of the first active tunable low-noise RF bandpass filter 12, at the first center frequency FCF, the first active tunable low-noise RF bandpass filter 12 has a first gain, and at the first frequency FF, the first active tunable low-noise RF bandpass filter 12 has a second gain, which is less than the first gain.

This technique of using selective frequency degeneration to control gain in the first active tunable low-noise RF bandpass filter 12 has two primary benefits. The first benefit is that the selective frequency degeneration primarily provides the bandpass response of the first active tunable low-noise RF bandpass filter 12. The second benefit is that by reducing gain of the first active tunable low-noise RF bandpass filter 12 in response to out of band RF signals, the first active tunable low-noise RF bandpass filter 12 can receive and filter larger magnitudes of such signals without going into compression. Avoiding compression is an important element in preserving linearity in an amplifier. Compression in an amplifier occurs when an incremental increase in a magnitude of an input signal to the amplifier does not cause a corresponding increase in a magnitude of an output signal from the amplifier. A one decibel out of band input compression point (IP1 dB) is a figure-of-merit for linearity well known in the art. Higher out of band IP1 dBs indicate that higher magnitudes of out of band signals can be properly received and filtered. In an exemplary embodiment of the first active tunable low-noise RF bandpass filter 12, a one decibel out of band compression point (IP1 dB) of the first active tunable low-noise RF bandpass filter 12 is greater than or equal to about zero decibel milliwatts.

A third-order intercept point (IP3) is another figure-of-merit for linearity in an amplifier. Third-order intermodulation products are generated as a result of intermixing two or more signals having different frequencies due to non-linearities in an amplifier. The IP3 of an amplifier is a theoretical power point at which a fundamental output line and a third-order distortion output line intercept. Higher IP3s indicate that higher magnitudes of out of band signals can be properly received and filtered. By providing high out of band compression points, the first active tunable low-noise RF bandpass filter 12 maintains linearity in the presence of large out of band signals and avoids intermixing out of band signals. As a result, the first active tunable low-noise RF bandpass filter 12 may have a high IP3.

Since the first active tunable low-noise RF bandpass filter 12 provides high in band gain and low out of band gain, in an exemplary embodiment of the first active tunable low-noise RF bandpass filter 12, the first active tunable low-noise RF bandpass filter 12 has at least six decibels of gain at the first center frequency FCF and less than or equal to negative six decibels of gain at the first frequency FF. It should be noted that negative decibels of gain are indicative that a magnitude of the first RF output signal FRFOUT is less than a magnitude of the first RF input signal FRFIN and that less gain is manifested as larger negative numbers, as is well known in the art.

For stability, the impedance presented by the tunable frequency selective degeneration circuit 16 to the first non-inverting output FNO may need to be primarily inductive and no more than slightly capacitive, As such, in an exemplary embodiment of the first active tunable low-noise RF bandpass filter 12, during operation of the first active tunable low-noise RF bandpass filter 12, the tunable frequency selective degeneration circuit 16 presents an inductive impedance to the first non-inverting output FNO over at least one-half of the first passband FPB.

In an exemplary embodiment of the first active tunable low-noise RF bandpass filter 12, the first center frequency FCF is tuned to a desired first center frequency using the first degeneration tuning signal FDTS. The desired first center frequency may be about equal to a frequency of a wanted RF receive signal being received by the RF front end circuitry 10. In an exemplary embodiment of the first active tunable low-noise RF bandpass filter 12, the tunable frequency selective degeneration circuit 16 provides series feedback to the first transistor element 18, such that gain of the first active tunable low-noise RF bandpass filter 12 is based on the series feedback. At the first frequency FF, the series feedback has a first magnitude and at the first center frequency FCF, the series feedback has a second magnitude, which is less than the first magnitude. At the first frequency FF, the first active tunable low-noise RF bandpass filter 12 has a first linearity and at the first center frequency FCF, the first active tunable low-noise RF bandpass filter 12 has a second linearity, which is less than or equal to the first linearity.

Figure 3:
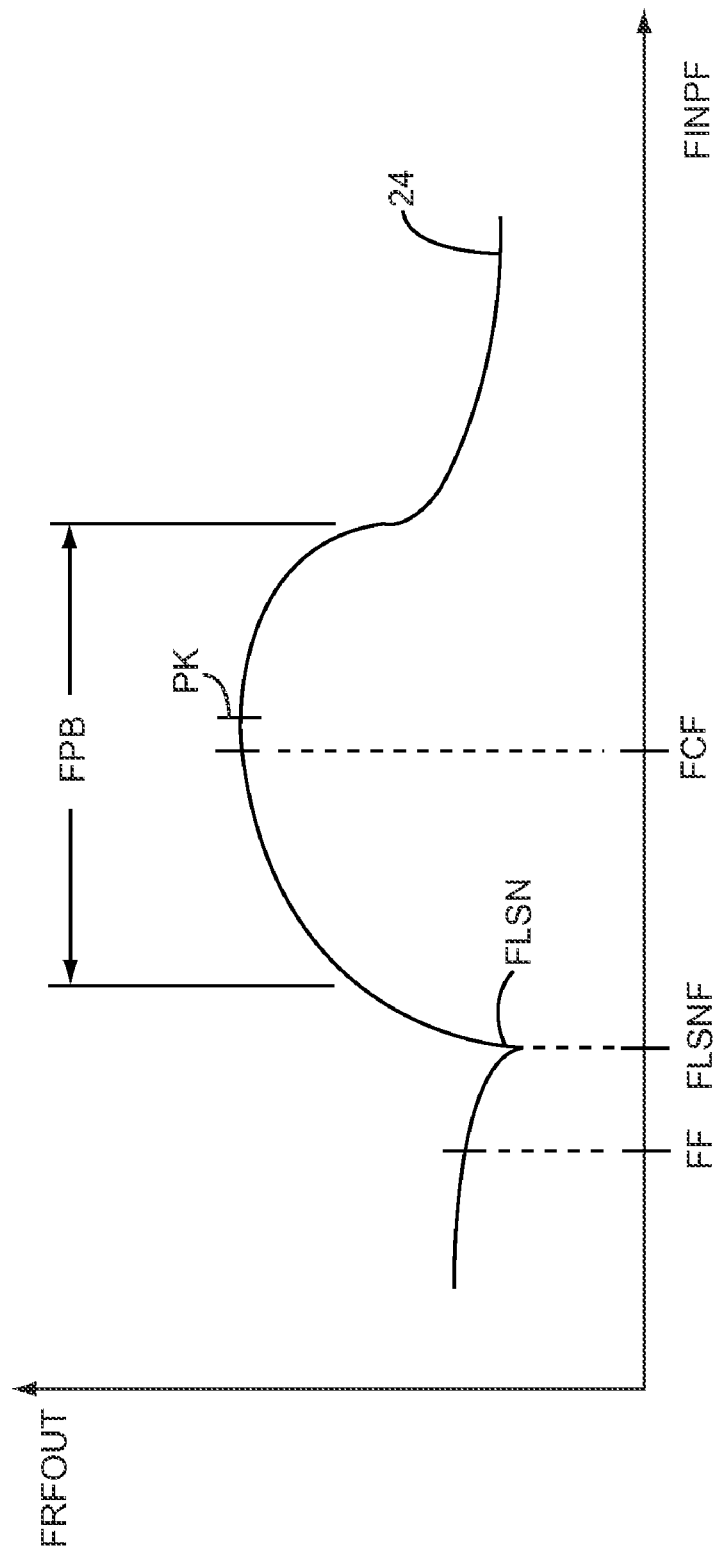
FIG. 3 is a graph showing a second frequency response curve of the first active tunable low-noise RF bandpass filter illustrated in FIG. 1 according to an alternate embodiment of the first active tunable low-noise RF bandpass filter.

FIG. 3 is a graph showing a second frequency response curve 24 of the first active tunable low-noise RF bandpass filter 12 illustrated in FIG. 1 according to an alternate embodiment of the first active tunable low-noise RF bandpass filter 12. The horizontal axis shows the first input frequency FINPF of the first RF input signal FRFIN and the vertical axis shows the magnitude of the first RF output signal FRFOUT. During operation of the first active tunable low-noise RF bandpass filter 12, the first active tunable low-noise RF bandpass filter 12 receives, amplifies, and filters the first RF input signal FRFIN to provide the first RF output signal FRFOUT. An impedance response of the tunable frequency selective degeneration circuit 16 may be asymmetrical, such that a bandpass filter response of the first active tunable low-noise RF bandpass filter 12 provides a first low-side notch FLSN having a first low-side notch frequency FLSNF based on the first degeneration tuning signal FDTS. The first active tunable low-noise RF bandpass filter 12 has the first passband FPB, such that the first center frequency FCF of the first passband FPB is based on the first degeneration tuning signal FDTS. The first center frequency FCF may or may not correlate with a peak PK in the second frequency response curve 24.

In an exemplary embodiment of the first active tunable low-noise RF bandpass filter 12, a first RF interference signal has a first interference frequency, the first active tunable low-noise RF bandpass filter 12 is tuned using the first degeneration tuning signal FDTS, such that the first low-side notch frequency FLSNF is about equal to the first interference frequency.

Figure 4:
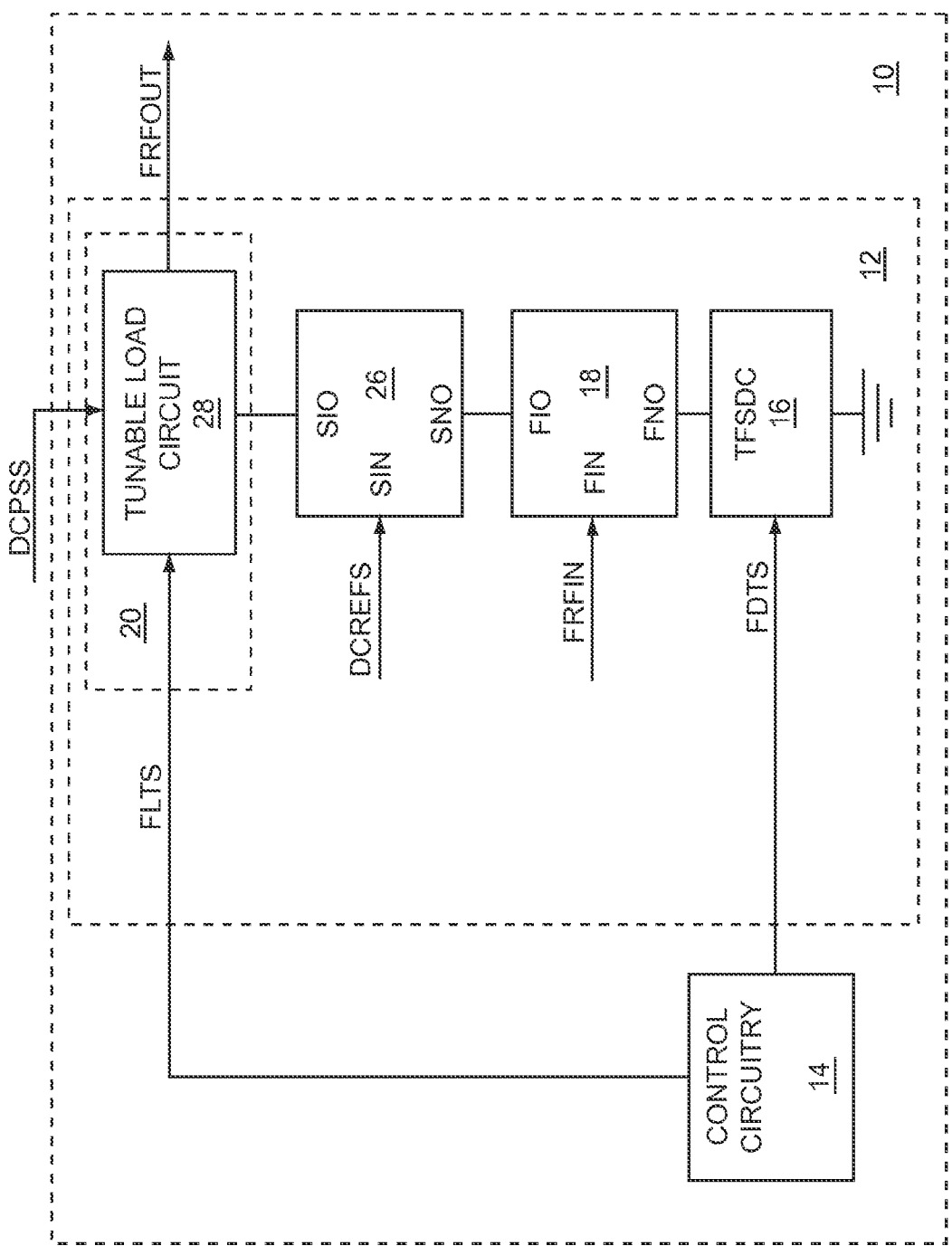
FIG. 4 shows the RF front end circuitry according to an alternate embodiment of the RF front end circuitry.

FIG. 4 shows the RF front end circuitry 10 according to an alternate embodiment of the RF front end circuitry 10. The RF front end circuitry 10 illustrated in FIG. 4 is similar to the RF front end circuitry 10 illustrated in FIG. 1, except in the RF front end circuitry 10 illustrated in FIG. 4, the first active tunable low-noise RF bandpass filter 12 further includes a second transistor element 26, the load circuit 20 includes a tunable load circuit 28, instead of the first inverting output FIO being coupled to the load circuit 20, the first inverting output FIO is coupled to a second non-inverting output SNO of the second transistor element 26, a second inverting output SIO of the second transistor element 26 is coupled to the tunable load circuit 28, a DC reference signal DCREFS feeds a second input SIN of the second transistor element 26, the tunable load circuit 28 provides the first RF output signal FRFOUT, and the control circuitry 14 further provides a first load tuning signal FLTS to the tunable load circuit 28. The first transistor element 18 and the second transistor element 26 form a cascode amplifier. During operation of the first active tunable low-noise RF bandpass filter 12, the first active tunable low-noise RF bandpass filter 12 receives, amplifies, and filters the first RF input signal FRFIN to provide the first RF output signal FRFOUT using the cascode amplifier.

The tunable load circuit 28 is coupled to the first inverting output FIO through the second transistor element 26. In an alternate embodiment of the first active tunable low-noise RF bandpass filter 12, the tunable load circuit 28 may be directly coupled to the first inverting output FIO. The tunable load circuit 28 may include bandpass circuitry, such that a bandpass frequency response of the tunable load circuit 28 is based on the first load tuning signal FLTS. The bandpass frequency response of the tunable load circuit 28 may combine with the impedance response of the tunable frequency selective degeneration circuit 16, such that the bandpass response of the first active tunable low-noise RF bandpass filter 12 is based on both the bandpass frequency response of the tunable load circuit 28 and the impedance response of the tunable frequency selective degeneration circuit 16. As such, the first center frequency FCF may be further based on the first load tuning signal FLTS.

In one embodiment of the first active tunable low-noise RF bandpass filter 12 illustrated in FIG. 4, the impedance response of the tunable frequency selective degeneration circuit 16 may be asymmetrical as illustrated in FIG. 3, such that the bandpass filter response of the first active tunable low-noise RF bandpass filter 12 provides the first low-side notch FLSN having the first low-side notch frequency FLSNF based on the first degeneration tuning signal FDTS. The first active tunable low-noise RF bandpass filter 12 has the first passband FPB, such that the first center frequency FCF of the first passband FPB is based on both the first degeneration tuning signal FDTS and the first load tuning signal FLTS. The first center frequency FCF may or may not correlate with a peak PK in the second frequency response curve 24.

In an exemplary embodiment of the first active tunable low-noise RF bandpass filter 12, the first RF interference signal has the first interference frequency, the first active tunable low-noise RF bandpass filter 12 is tuned using the first degeneration tuning signal FDTS, such that the first low-side notch frequency FLSNF is about equal to the first interference frequency, and the first active tunable low-noise RF bandpass filter 12 is tuned using the first load tuning signal FLTS, such that a frequency of the peak PK in the bandpass filter response of the first active tunable low-noise RF bandpass filter 12 is about equal to a desired first center frequency.

Figure 5:
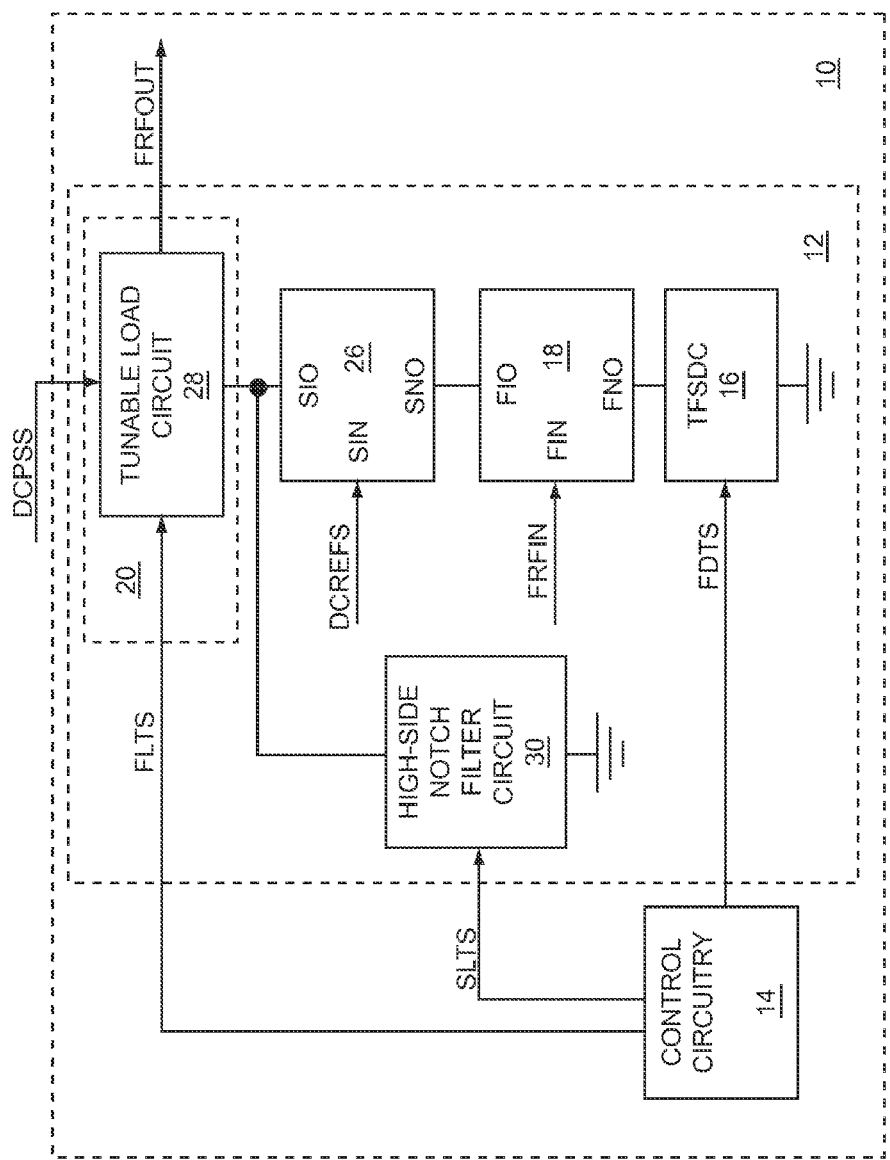
FIG. 5 shows the RF front end circuitry according to an additional embodiment of the RF front end circuitry.

FIG. 5 shows the RF front end circuitry 10 according to an additional embodiment of the RF front end circuitry 10. The RF front end circuitry 10 illustrated in FIG. 5 is similar to the RF front end circuitry 10 illustrated in FIG. 4, except in the RF front end circuitry 10 illustrated in FIG. 5, the first active tunable low-noise RF bandpass filter 12 further includes a high-side notch filter circuit 30 coupled to the second inverting output SIO and the control circuitry 14 further provides a second load tuning signal SLTS to the high-side notch filter circuit 30. During operation of the first active tunable low-noise RF bandpass filter 12, the first active tunable low-noise RF bandpass filter 12 receives, amplifies, and filters the first RF input signal FRFIN to provide the first RF output signal FRFOUT using the cascode amplifier. A high-side notch frequency response of the high-side notch filter circuit 30 is based on the second load tuning signal SLTS. As such, a high-side notch filter response of the first active tunable low-noise RF bandpass filter 12 is based on the high-side notch frequency response of the high-side notch filter circuit 30. A first high-side notch frequency FHSNF may be based on the second load tuning signal SLTS.

The high-side notch filter circuit 30 is coupled to the first inverting output FIO through the second transistor element 26. In an alternate embodiment of the first active tunable low-noise RF bandpass filter 12, the high-side notch filter circuit 30 may be directly coupled to the first inverting output FIO.

Figure 6:
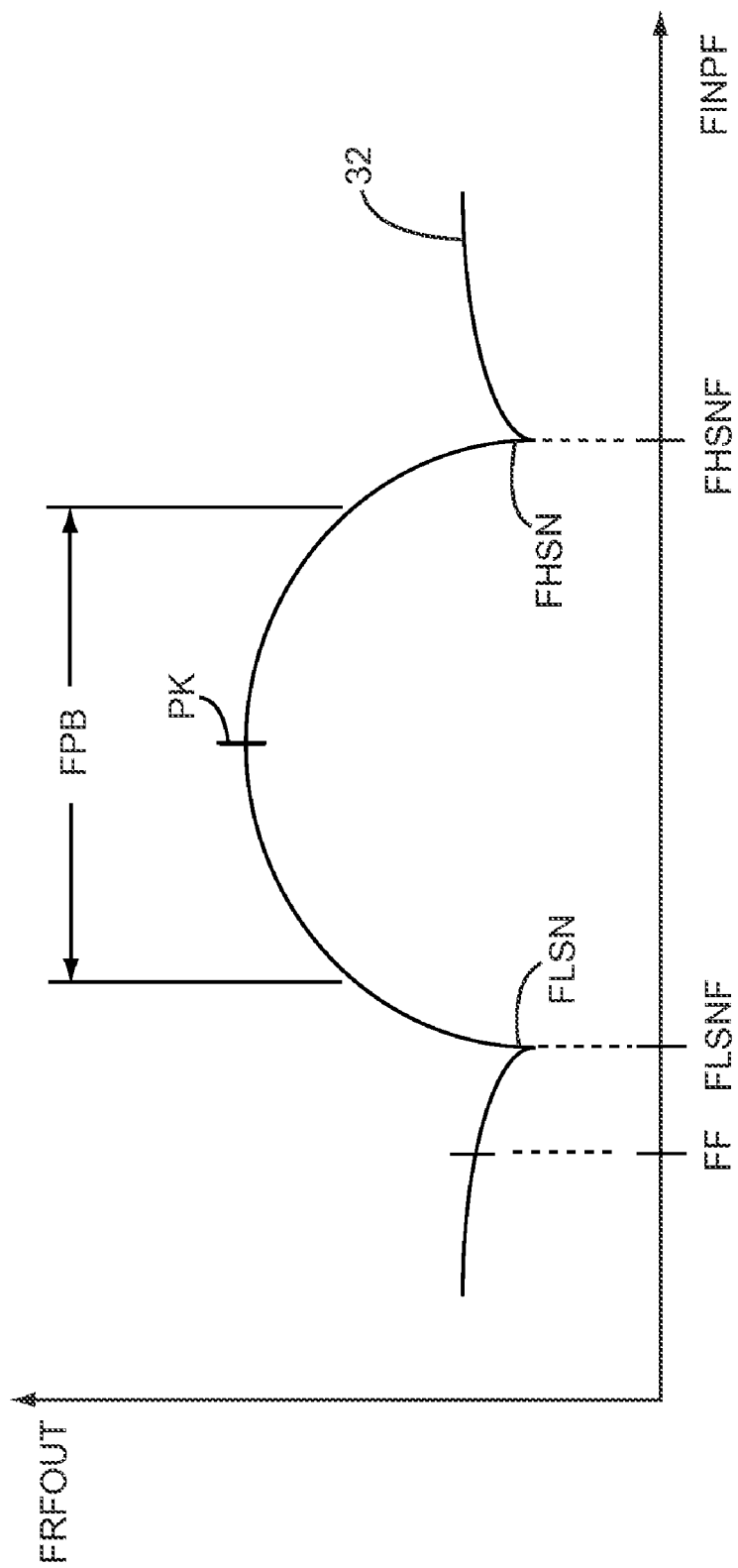
FIG. 6 is a graph showing a third frequency response curve of the first active tunable low-noise RF bandpass filter illustrated in FIG. 5.

FIG. 6 is a graph showing a third frequency response curve 32 of the first active tunable low-noise RF bandpass filter 12 illustrated in FIG. 5, such that the bandpass filter response of the first active tunable low-noise RF bandpass filter 12 includes the effects of the asymmetrical impedance response of the tunable frequency selective degeneration circuit 16 illustrated in FIG. 3 and further includes the effects of the high-side notch filter circuit 30.

The third frequency response curve 32 has the first low-side notch FLSN having the first low-side notch frequency FLSNF based on the first degeneration tuning signal FDTS and a first high-side notch FHSN having the first high-side notch frequency FHSNF based on the second load tuning signal SLTS. The first active tunable low-noise RF bandpass filter 12 has the first passband FPB, such that the first center frequency FCF of the first passband FPB is based on both the first degeneration tuning signal FDTS and the first load tuning signal FLTS. The first center frequency FCF may or may not correlate with a peak PK in the second frequency response curve 24.

By combining the effects of the tunable frequency selective degeneration circuit 16, the tunable load circuit 28, and the high-side notch filter circuit 30, the first active tunable low-noise RF bandpass filter 12 may have a high-Q bandpass filter response. Using the first degeneration tuning signal FDTS to tune the first low-side notch frequency FLSNF to be about equal to a frequency of a close-in low-side interfering RF signal, using the second load tuning signal SLTS to tune the first high-side notch frequency FHSNF to be about equal to a frequency of a close-in high-side interfering RF signal, and using the first load tuning signal FLTS to tune a frequency of the peak PK of the third frequency response curve 32 to about equal to a frequency of a desired RF receive signal may provide a very effective active bandpass filter, which provides good amplification of the desired RF receive signal and provides good attenuation of the close-in interfering signals with good linearity and without going into compression.

As such, in an exemplary embodiment of the first active tunable low-noise RF bandpass filter 12, a first RF interference signal has a first interference frequency, a second RF interference signal has a second interference frequency, the first active tunable low-noise RF bandpass filter 12 is tuned using the first degeneration tuning signal FDTS, such that the first low-side notch frequency FLSNF is about equal to the first interference frequency, the first active tunable low-noise RF bandpass filter 12 is tuned using the second load tuning signal SLTS, such that the first high-side notch frequency FHSNF is about equal to the second interference frequency, and the first active tunable low-noise RF bandpass filter 12 is tuned using the first load tuning signal FLTS, such that a frequency of the peak PK in the bandpass filter response of the first active tunable low-noise RF bandpass filter 12 is about equal to a desired first center frequency.

Figure 7:
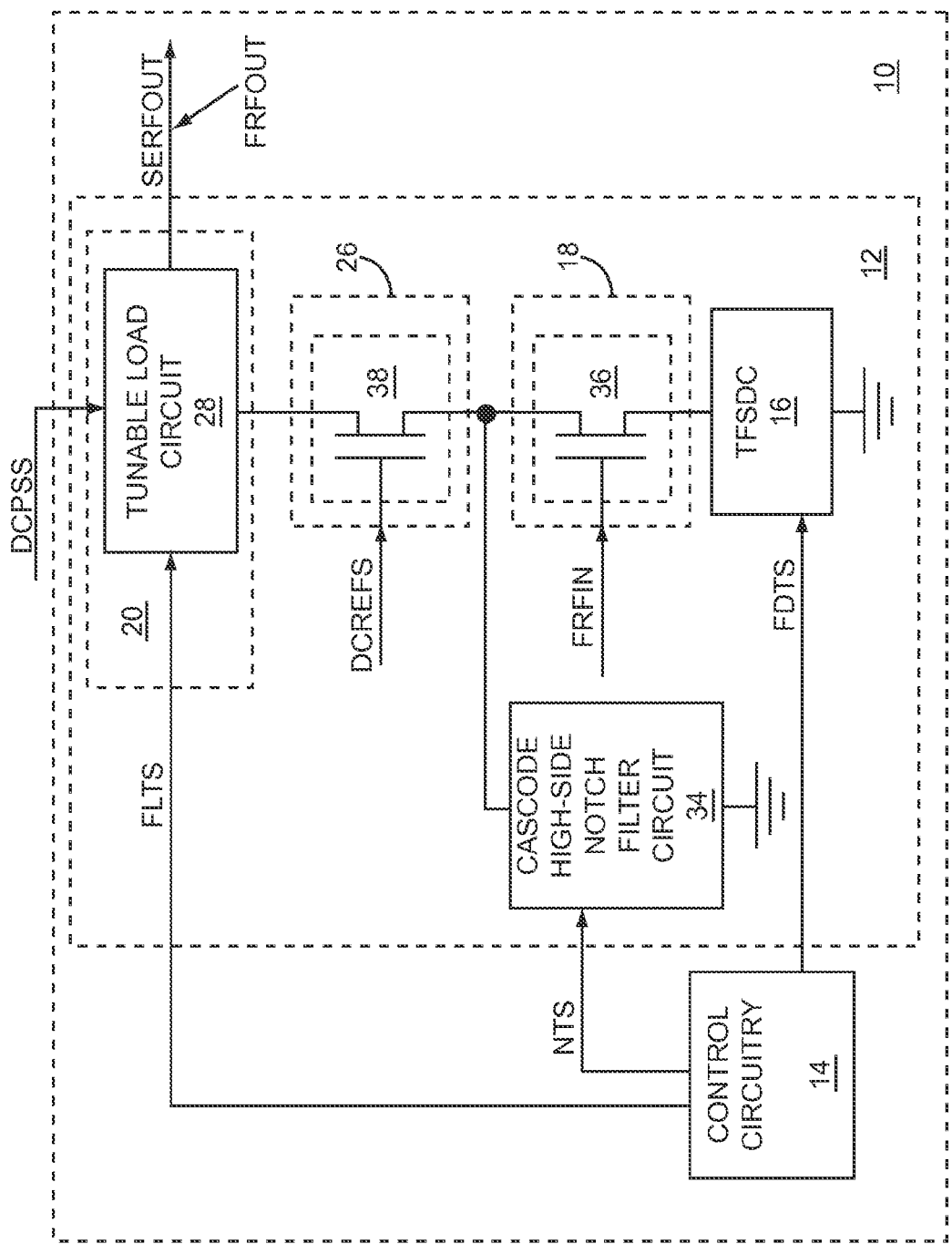
FIG. 7 shows the RF front end circuitry according to another embodiment of the RF front end circuitry.

FIG. 7 shows the RF front end circuitry 10 according to another embodiment of the RF front end circuitry 10. The RF front end circuitry 10 illustrated in FIG. 7 is similar to the RF front end circuitry 10 illustrated in FIG. 4, except in the RF front end circuitry 10 illustrated in FIG. 7, the first active tunable low-noise RF bandpass filter 12 further includes a cascode high-side notch filter circuit 34, the first transistor element 18 is a first field effect transistor (FET) element 36, the second transistor element 26 is a second FET element 38, and the tunable load circuit 28 has a single-ended output, which provides a single-ended RF output signal SERFOUT as the first RF output signal FRFOUT. The first FET element 36 has a first source, a first drain, and a first gate, such that the first non-inverting output FNO is the first source, the first input FIN is the first gate, and the first inverting output FIO is the first drain. The second FET element 38 has a second source, a second drain, and a second gate, such that the second non-inverting output SNO is the second source, the second input SIN is the second gate, and the second inverting output SIO is the second drain.

The cascode high-side notch filter circuit 34 may be used as an alternative to the high-side notch filter circuit 30. The cascode high-side notch filter circuit 34 is coupled to the first inverting output FIO. The control circuitry 14 provides a notch tuning signal NTS to the cascode high-side notch filter circuit 34. A cascode high-side notch frequency response having a cascode high-side notch frequency of the cascode high-side notch filter circuit 34 is based on the notch tuning signal NTS. A high-side notch filter response of the first active tunable low-noise RF bandpass filter 12 is based on the cascode high-side notch frequency response of the cascode high-side notch filter circuit 34. The cascode high-side notch frequency is based on the notch tuning signal NTS. In other embodiments of the RF front end circuitry 10, cascode high-side notch filter circuit 34 and the notch tuning signal NTS may be omitted, the first transistor element 18 may be a different type of transistor element, the second transistor element 26 may be a different type of transistor element, the output that provides the first RF output signal FRFOUT may be a different type of output, or any combination thereof.

Figure 8:
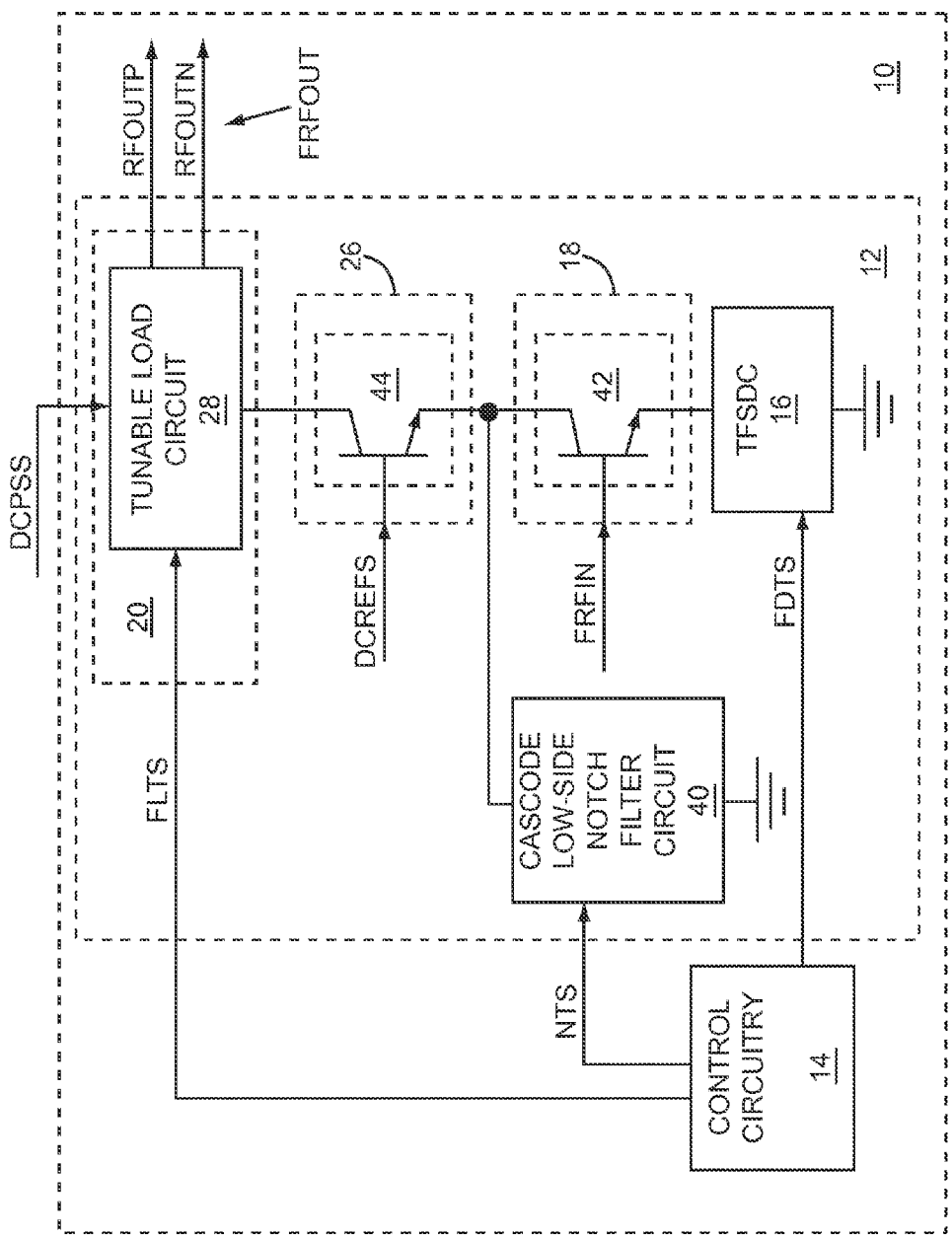
FIG. 8 shows the RF front end circuitry according to a supplemental embodiment of the RF front end circuitry.

FIG. 8 shows the RF front end circuitry 10 according to a supplemental embodiment of the RF front end circuitry 10. The RF front end circuitry 10 illustrated in FIG. 8 is similar to the RF front end circuitry 10 illustrated in FIG. 4, except in the RF front end circuitry 10 illustrated in FIG. 8, the first active tunable low-noise RF bandpass filter 12 further includes a cascode low-side notch filter circuit 40, the first transistor element 18 is a first bipolar transistor element 42, the second transistor element 26 is a second bipolar transistor element 44, and the tunable load circuit 28 has a differential output, which provides a positive-side differential RF output signal RFOUTP and a negative-side differential RF output signal RFOUTN as the first RF output signal FRFOUT. The first bipolar transistor element 42 has a first emitter, a first collector, and a first base, such that the first non-inverting output FNO is the first emitter, the first input FIN is the first base, and the first inverting output FIO is the first collector. The second bipolar transistor element 44 has a second emitter, a second collector, and a second base, such that the second non-inverting output SNO is the second emitter, the second input SIN is the second base, and the second inverting output SIO is the second collector.

The cascode low-side notch filter circuit 40 may be used as an alternative to the asymmetrical response provided by the tunable frequency selective degeneration circuit 16. The cascode low-side notch filter circuit 40 is coupled to the first inverting output FIO. The control circuitry 14 provides the notch tuning signal NTS to the cascode low-side notch filter circuit 40. A cascode low-side notch frequency response having a cascode low-side notch frequency of the cascode low-side notch filter circuit 40 is based on the notch tuning signal NTS. A low-side notch filter response of the first active tunable low-noise RF bandpass filter 12 is based on the cascode low-side notch frequency response of the cascode low-side notch filter circuit 40. The cascode low-side notch frequency is based on the notch tuning signal NTS. In other embodiments of the RF front end circuitry 10, the cascode low-side notch filter circuit 40 and the notch tuning signal NTS may be omitted, the first transistor element 18 may be a different type of transistor element, the second transistor element 26 may be a different type of transistor element, the output that provides the first RF output signal FRFOUT may be a different type of output, or any combination thereof.

Figure 9:
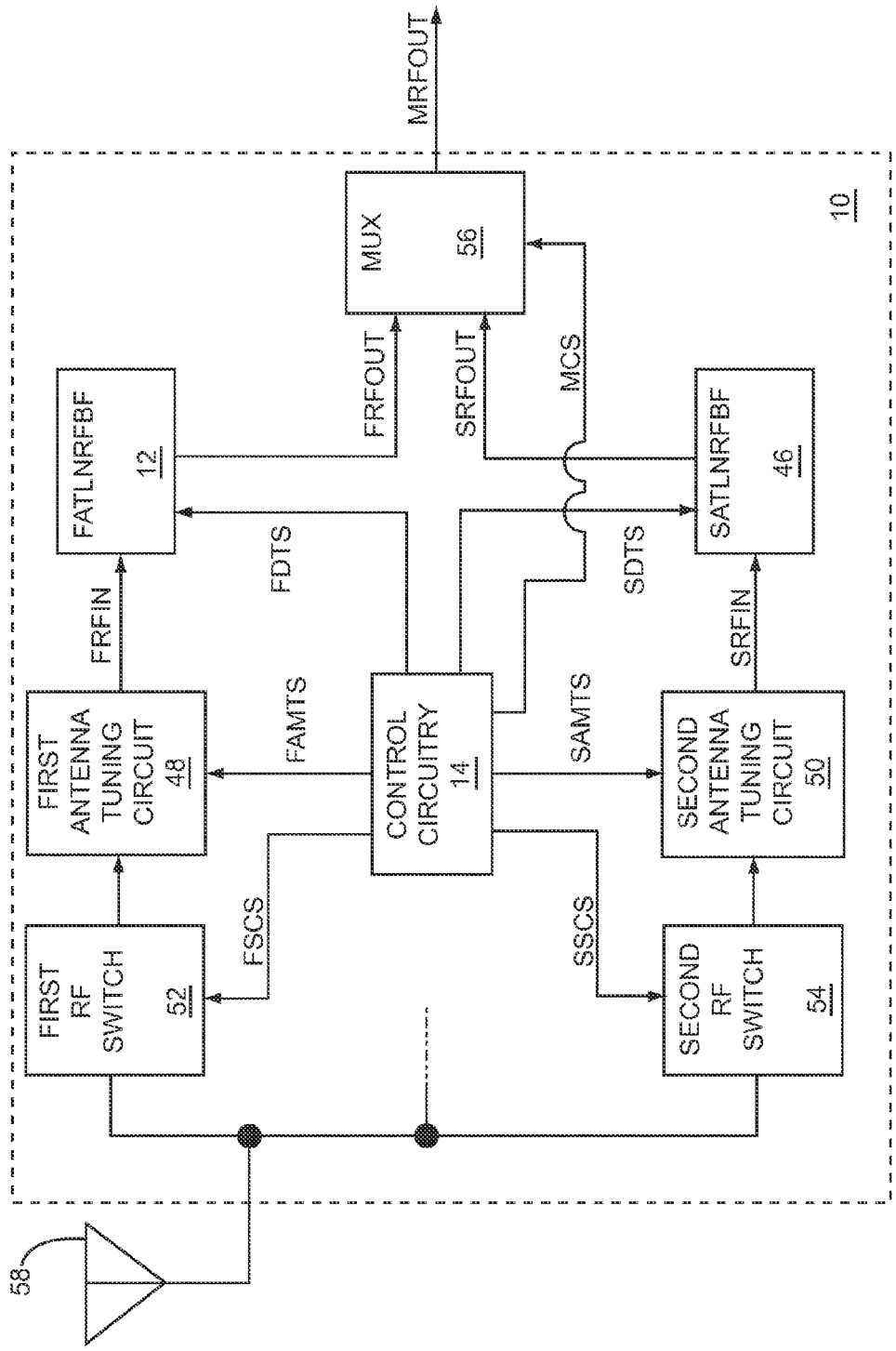
FIG. 9 shows the RF front end circuitry according to one system embodiment of the RF front end circuitry.

FIG. 9 shows the RF front end circuitry 10 according to a half-duplex system embodiment of the RF front end circuitry 10. The RF front end circuitry 10 includes the first active tunable low-noise RF bandpass filter 12, a second active tunable low-noise RF bandpass filter 46, a first antenna tuning circuit 48, a second antenna tuning circuit 50, a first RF switch 52, a second RF switch 54, and a multiplexer 56. An antenna 58 is coupled to the first RF switch 52 and the second RF switch 54. The first antenna tuning circuit 48 is coupled between the first RF switch 52 and the first active tunable low-noise RF bandpass filter 12. The second antenna tuning circuit 50 is coupled between the second RF switch 54 and the second active tunable low-noise RF bandpass filter 46. The control circuitry 14 provides the first degeneration tuning signal FDTS to the first active tunable low-noise RF bandpass filter 12, provides a second degeneration tuning signal SDTS to the second active tunable low-noise RF bandpass filter 46, and provides a first antenna match tuning signal FAMTS to the first antenna tuning circuit 48. The control circuitry 14 further provides a second antenna match tuning signal SAMTS to the second antenna tuning circuit 50, provides a first switch control signal FSCS to the first RF switch 52, provides a second switch control signal SSCS to the second RF switch 54, and provides a multiplexer control signal MCS to the multiplexer 56.

The first active tunable low-noise RF bandpass filter 12 provides the first RF output signal FRFOUT based on amplifying and filtering the first RF input signal FRFIN and a bandpass response of the first active tunable low-noise RF bandpass filter 12. The second active tunable low-noise RF bandpass filter 46 receives, amplifies, and filters a second RF input signal SRFIN to provide a second RF output signal SRFOUT based on a bandpass response of the second active tunable low-noise RF bandpass filter 46. The multiplexer 56 receives the first RF output signal FRFOUT and the second RF output signal SRFOUT, and provides a multiplexed RF output signal MRFOUT based on a selected one of the first RF output signal FRFOUT and the second RF output signal SRFOUT. Selection of the one of the first RF output signal FRFOUT and the second RF output signal SRFOUT is based on the multiplexer control signal MCS.

In an exemplary embodiment of the RF front end circuitry 10, the RF front end circuitry 10 is multi-band RF front-end circuitry and the first active tunable low-noise RF bandpass filter 12 is a highband RF bandpass filter and the second active tunable low-noise RF bandpass filter 46 is a lowband RF bandpass filter. As such, the first active tunable low-noise RF bandpass filter 12, the first antenna tuning circuit 48, the first RF switch 52, and the antenna 58 form a first receive path between the first active tunable low-noise RF bandpass filter 12 and the antenna 58. The first receive path may be a highband receive path. Similarly, the second active tunable low-noise RF bandpass filter 46, the second antenna tuning circuit 50, the second RF switch 54, and the antenna 58 form a second receive path between the second active tunable low-noise RF bandpass filter 46 and the antenna 58. The second receive path may be a lowband receive path. Two active tunable low-noise RF bandpass filters may be used when a tuning range of a single active tunable low-noise RF bandpass filter is insufficient. For example, a tuning range of an active tunable low-noise RF bandpass filter may be less than an octave, which is a frequency ratio of two to one. However, a highband operating frequency may have more an octave separation from a lowband operating frequency. In a first exemplary embodiment of the RF front end circuitry 10, there is no surface acoustic wave (SAW) filter in the first receive path, there is no bulk acoustic wave (BAW) filter in the first receive path, there is no SAW filter in the second receive path, and there is no BAW filter in the second receive path.

The first RF switch 52 may be closed, thereby enabling the first receive path using the first switch control signal FSCS. Similarly, the second RF switch 54 may be closed, thereby enabling the second receive path using the second switch control signal SSCS. When the first receive path is enabled, the first antenna tuning circuit 48 provides an approximate impedance match to the first RF switch 52 at the first center frequency FCF based on the first antenna match tuning signal FAMTS, which is provided by the control circuitry 14. Similarly, when the second receive path is enabled, the second antenna tuning circuit 50 provides an approximate impedance match to the second RF switch 54 at a second center frequency based on the second antenna match tuning signal SAMTS, which is provided by the control circuitry 14. The first antenna tuning circuit 48 provides the first RF input signal FRFIN to the first active tunable low-noise RF bandpass filter 12, and the second antenna tuning circuit 50 provides the second RF input signal SRFIN to the second active tunable low-noise RF bandpass filter 46.

Figure 10:
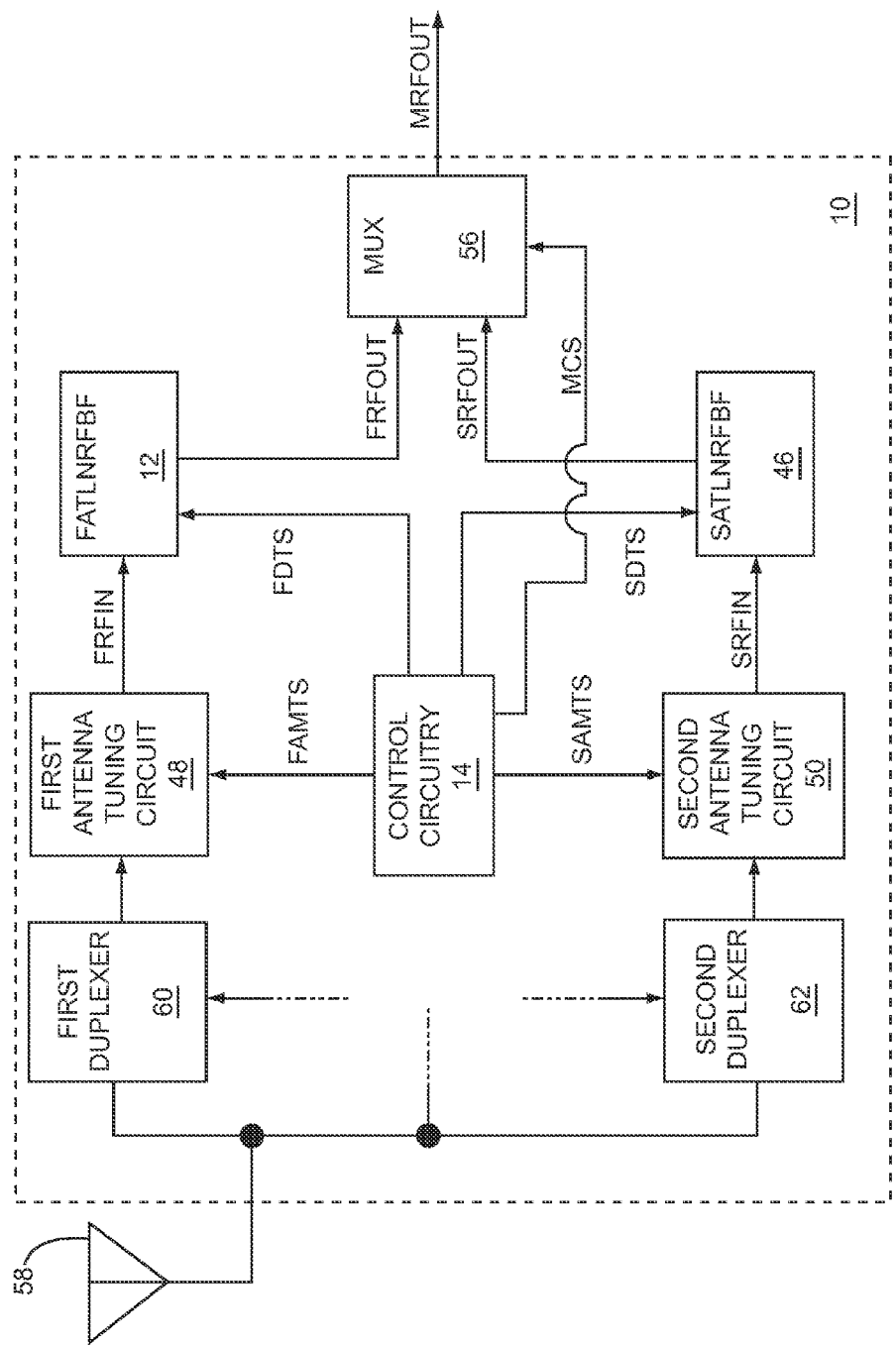
FIG. 10 shows the RF front end circuitry according to an alternate system embodiment of the RF front end circuitry.

FIG. 10 shows the RF front end circuitry 10 according to a full-duplex system embodiment of the RF front end circuitry 10. The RF front end circuitry 10 illustrated in FIG. 10 is similar to the RF front end circuitry 10 illustrated in FIG. 9, except in the RF front end circuitry 10 illustrated in FIG. 10, the first RF switch 52 and the second RF switch 54 are replaced with a first duplexer 60 and a second duplexer 62, respectively.

Figure 11:
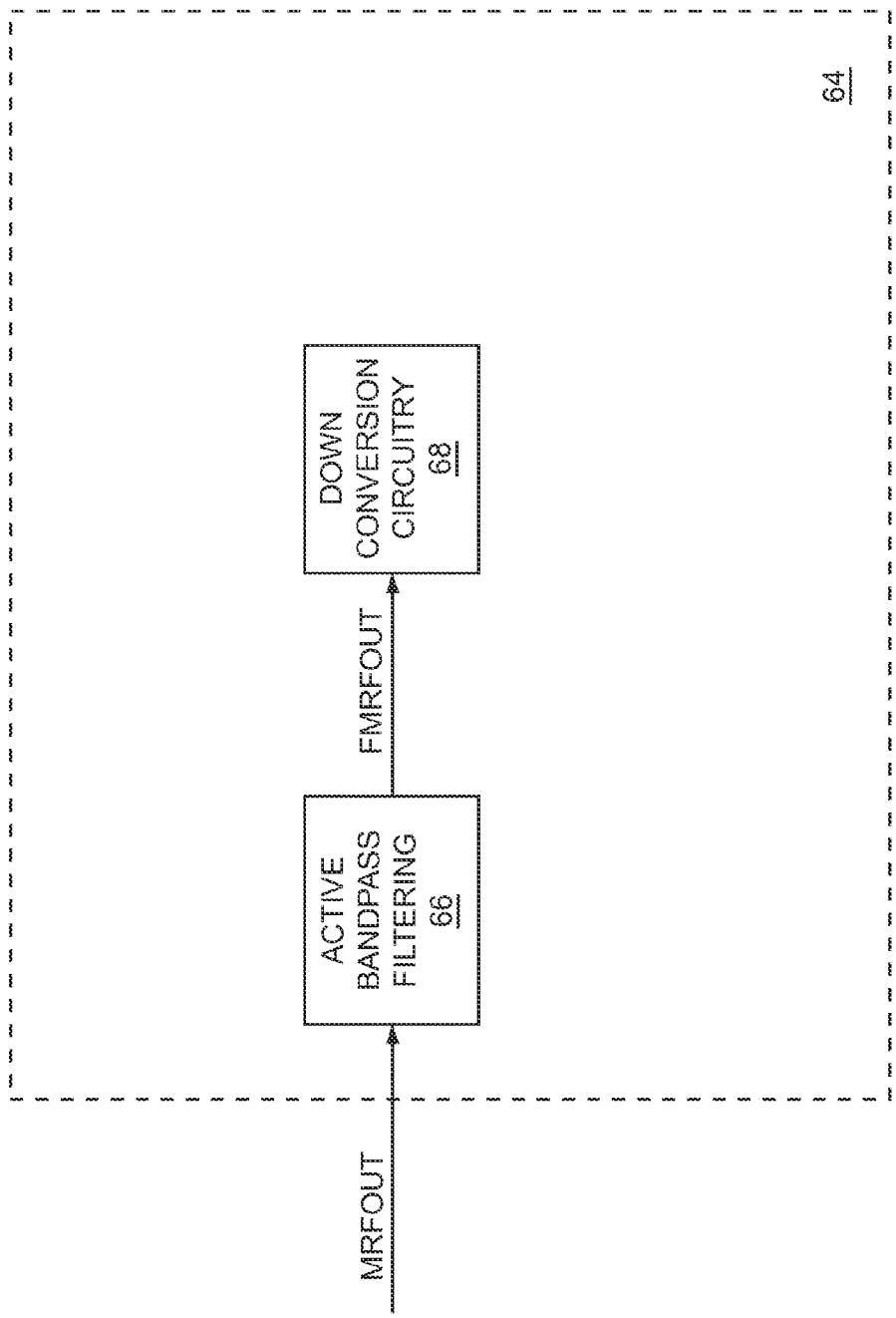
FIG. 11 shows system circuitry according to one embodiment of the system circuitry.

FIG. 11 shows system circuitry 64 according to one embodiment of the system circuitry 64. The system circuitry 64 may be an SoC. The system circuitry 64 includes active bandpass filtering 66 and down conversion circuitry 68. The multiplexed RF output signal MRFOUT feeds the active bandpass filtering 66, which filters the multiplexed RF output signal MRFOUT to provide a filtered multiplexed RF output signal FMRFOUT to the down conversion circuitry 68. The first active tunable low-noise RF bandpass filter 12, the second active tunable low-noise RF bandpass filter 46, or both may provide only sufficient amplification and filtering to allow the active bandpass filtering 66 and the down conversion circuitry 68 to operate properly. By using the second active tunable low-noise RF bandpass filter 46 and the first active tunable low-noise RF bandpass filter 12, phase noise requirements, compression requirements, or both may be relaxed. In a first exemplary embodiment of the RF front end circuitry 10 and the system circuitry 64, there is no SAW filter in a receive path between the second active tunable low-noise RF bandpass filter 46 and the down conversion circuitry 68, there is no BAW filter in the receive path between the second active tunable low-noise RF bandpass filter 46 and the down conversion circuitry 68, there is no SAW filter in the receive path between the first active tunable low-noise RF bandpass filter 12 and the down conversion circuitry 68, and there is no BAW filter in the receive path between the first active tunable low-noise RF bandpass filter 12 and the down conversion circuitry 68.

Figure 12:
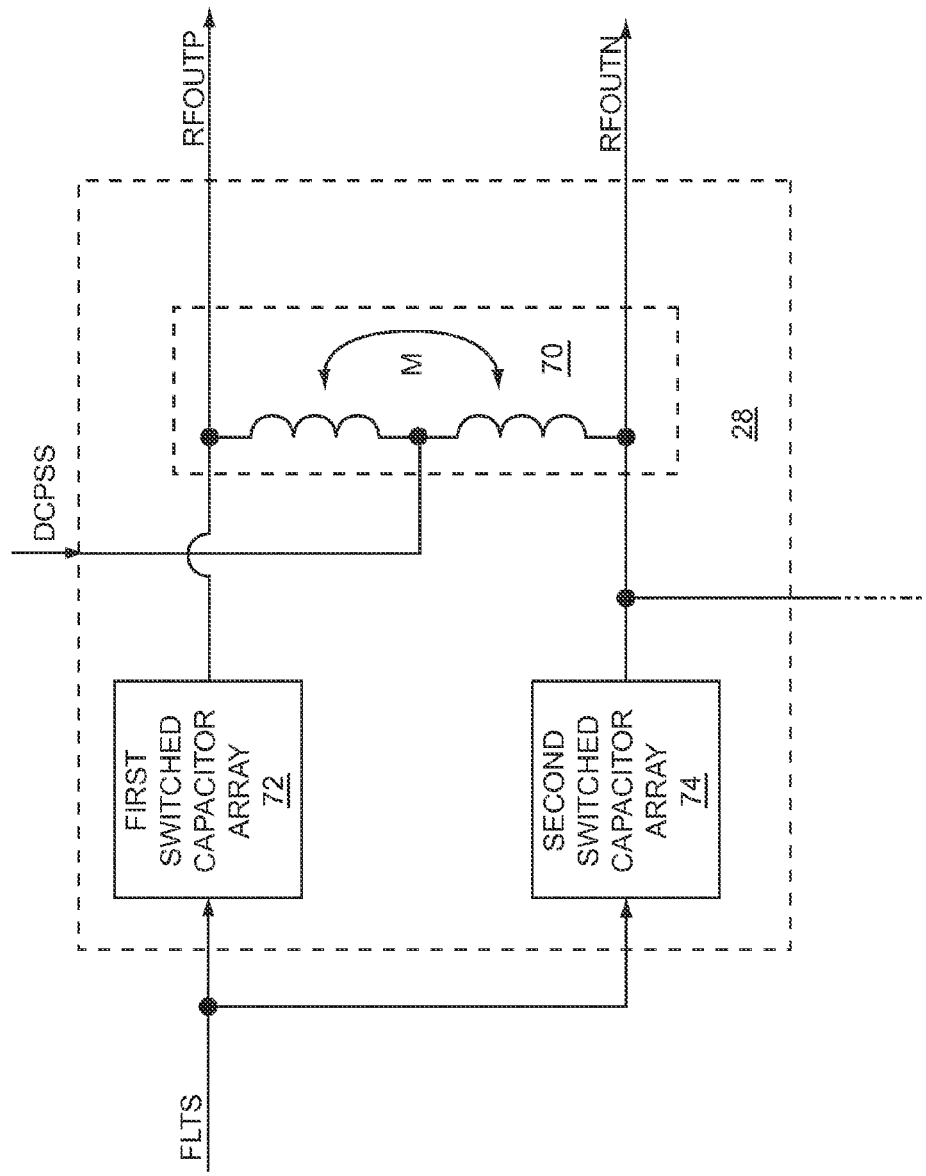
FIG. 12 shows details of a tunable load circuit illustrated in FIG. 8 according to one embodiment of the tunable load circuit.

FIG. 12 shows details of the tunable load circuit 28 illustrated in FIG. 8 according to one embodiment of the tunable load circuit 28. The tunable load circuit 28 includes a center-tapped auto-transformer 70, a first switched capacitor array 72, and a second switched capacitor array 74. The center-tap of the center-tapped auto-transformer 70 receives the DC power supply signal DCPSS. A first leg of the center-tapped auto-transformer 70 is coupled to the first switched capacitor array 72 and provides the positive-side differential RF output signal RFOUTP. A second leg of the center-tapped auto-transformer 70 is coupled to the second switched capacitor array 74 and the second transistor element 26, and provides the negative-side differential RF output signal RFOUTN. The first leg and the first switched capacitor array 72, and the second leg and the second switched capacitor array 74 convert the single-ended signal provided by the second transistor element 26 to a differential signal. The first leg and the second leg have mutual inductance M. Each of the first switched capacitor array 72 and the second switched capacitor array 74 receives the first load tuning signal FLTS and has a corresponding capacitance based on the first load tuning signal FLTS. The first leg and the capacitance of the first switched capacitor array 72, and the second leg and the capacitance of the second switched capacitor array 74 form series resonant circuits, which provides the bandpass frequency response of the tunable load circuit 28. In an alternate embodiment of the tunable load circuit 28, the first switched capacitor array 72 may be omitted.

Figure 13:
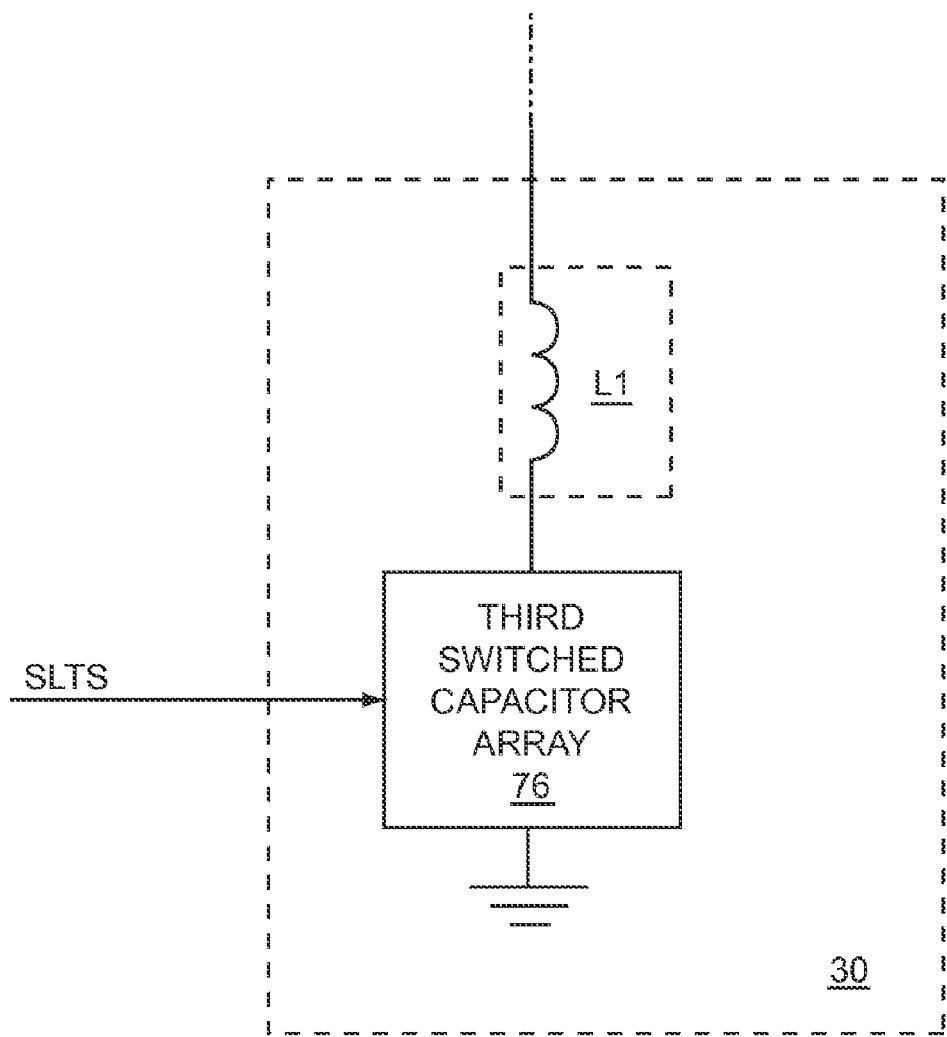
FIG. 13 shows details of a high-side notch filter circuit illustrated in FIG. 5 according to one embodiment of the high-side notch filter circuit.

FIG. 13 shows details of the high-side notch filter circuit 30 illustrated in FIG. 5 according to one embodiment of the high-side notch filter circuit 30. The high-side notch filter circuit 30 includes a first inductive element L1 and a third switched capacitor array 76. The first inductive element L1 and the third switched capacitor array 76 are coupled in series to form a series resonant circuit based on an inductance of the first inductive element L1 and a capacitance of the third switched capacitor array 76, such that at a resonant frequency of the first inductive element L1 and the third switched capacitor array 76, the high-side notch filter circuit 30 provides the first high-side notch FHSN. The third switched capacitor array 76 receives the second load tuning signal SLTS and the capacitance of the third switched capacitor array 76 is based on the second load tuning signal SLTS. Therefore, the first high-side notch frequency FHSNF is based on the second load tuning signal SLTS. The first inductive element L1 may be provided by at least one bond wire, by a printed inductor on a laminate, by a surface mount device, or any combination thereof. The Q of the filter may be directly related to the Q of the first inductive element L1. The cascode high-side notch filter circuit 34 and the cascode low-side notch filter circuit 40 may be constructed in a similar manner to the high-side notch filter circuit 30.

Figure 14:
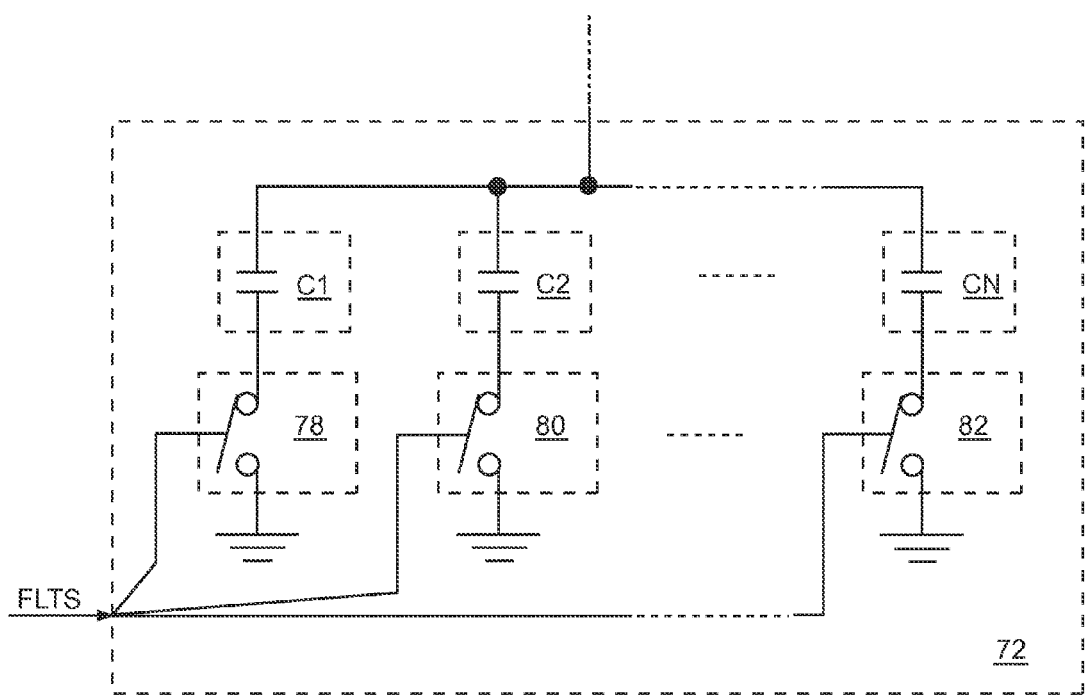
FIG. 14 shows details of a first switched capacitor array illustrated in FIG. 12 according to one embodiment of the first switched capacitor array.

FIG. 14 shows details of the first switched capacitor array 72 illustrated in FIG. 12 according to one embodiment of the first switched capacitor array 72. The first switched capacitor array 72 includes a first switching element 78, a second switching element 80, and up to and including an $N^{TH}$ switching element 82. The first switched capacitor array 72 further includes a first capacitive element C1, a second capacitive element C2, and up to and including an $N^{TH}$ capacitive element CN. Each of the capacitive elements C1, C2, CN is coupled in series with a corresponding one of the switching elements 78, 80, 82, and all of the series capacitive element and switch couplings are coupled in parallel to one another, such that when one of the switching elements 78, 80, 82 is CLOSED, its corresponding one of the capacitive elements C1, C2, CN contributes to the capacitance of the first switched capacitor array 72. The switching elements 78, 80, 82 are controlled by the first load tuning signal FLTS. Therefore, the capacitance of the first switched capacitor array 72 is based on the first load tuning signal FLTS. The second switched capacitor array 74 and the third switched capacitor array 76 may be constructed in a similar manner to the first switched capacitor array 72.

Figure 15:
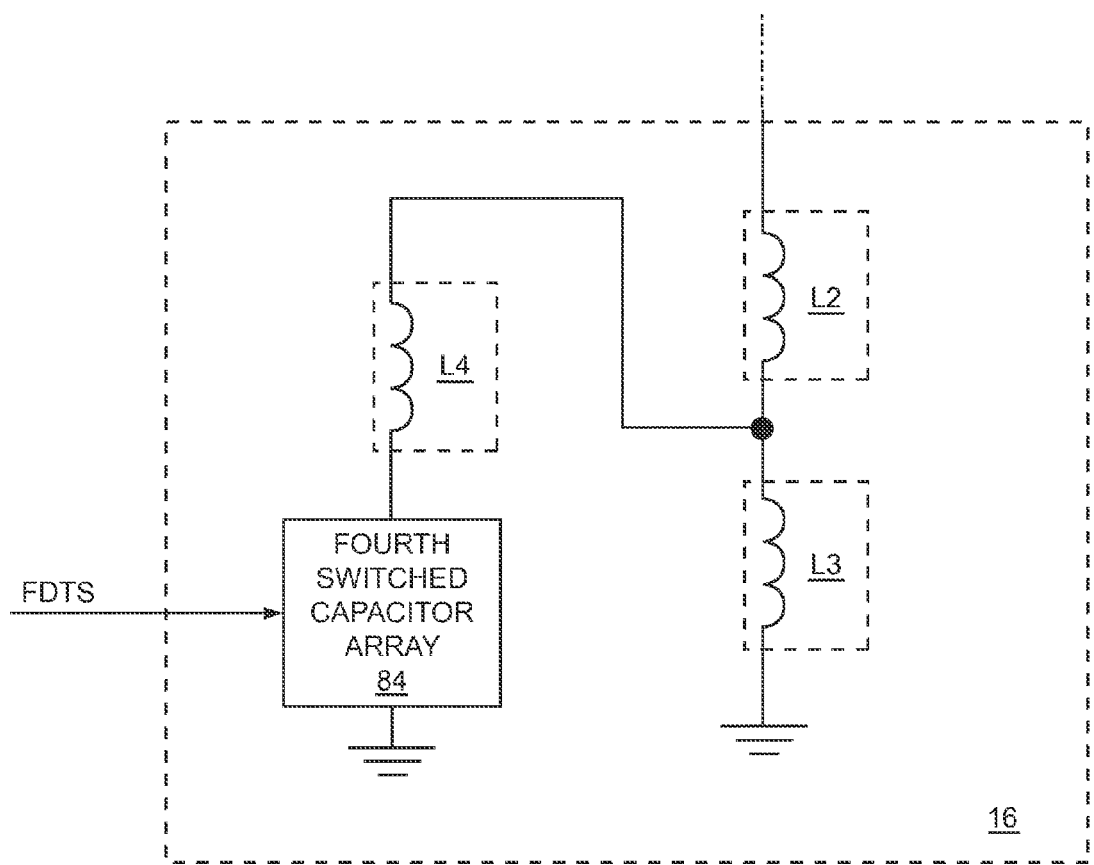
FIG. 15 shows details of a tunable frequency selective degeneration circuit illustrated in FIG. 1 according to one embodiment of the tunable frequency selective degeneration circuit.

FIG. 15 shows details of the tunable frequency selective degeneration circuit 16 illustrated in FIG. 1 according to one embodiment of the tunable frequency selective degeneration circuit 16. The tunable frequency selective degeneration circuit 16 includes a second inductive element L2, a third inductive element L3, a fourth inductive element L4, and a fourth switched capacitor array 84. The second inductive element L2 and the third inductive element L3 are coupled in series between ground and the first non-inverting output FNO. The fourth inductive element L4 and the fourth switched capacitor array 84 are coupled in series between ground and a node coupling the second inductive element L2 to the third inductive element L3. The fourth switched capacitor array 84 receives the first degeneration tuning signal FDTS, such that a capacitance of the fourth switched capacitor array 84 is based on the first degeneration tuning signal FDTS. As such, the second inductive element L2, the third inductive element L3, the fourth inductive element L4, and the capacitance provided by the fourth switched capacitor array 84 provide the degeneration impedance response to the first non-inverting output FNO. Any or all of the second inductive element L2, the third inductive element L3, and the fourth inductive element L4 may be provided by at least one bond wire, by a printed inductor on a laminate, by a surface mount device, or any combination thereof. The Q of the first active tunable low-noise RF bandpass filter 12 may be directly related to the Q of any or all of the second inductive element L2, the third inductive element L3, and the fourth inductive element L4.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) front end circuitry comprising:
a first active tunable low-noise RF bandpass filter adapted to receive, amplify, and filter a first RF input signal and comprising:
at least a first transistor element adapted to receive the first RF input signal; and
a tunable frequency selective degeneration circuit coupled to a first non-inverting output of the first transistor element, such that during operation of the first active tunable low-noise RF bandpass filter:
the first active tunable low-noise RF bandpass filter has a first passband;
a first center frequency of the first passband is based on a first degeneration tuning signal;
at the first center frequency, the tunable frequency selective degeneration circuit presents a first impedance to the first non-inverting output based on the first degeneration tuning signal;
at a first frequency outside of the first passband, the tunable frequency selective degeneration circuit presents a second impedance to the first non-inverting output based on the first degeneration tuning signal; and
the second impedance is greater than the first impedance; and
control circuitry adapted to provide the first degeneration tuning signal, wherein at the first center frequency, the first active tunable low-noise RF bandpass filter has a first gain, and at the first frequency outside of the first passband, the first active tunable low-noise RF bandpass filter has a second gain, which is less than the first gain; and
further comprising a first antenna tuning circuit coupled between the first active tunable low-noise RF bandpass filter and a first RF switch, such that, during operation of the first active tunable low-noise RF bandpass filter:
the control circuitry is further adapted to provide a first antenna match tuning signal; and
the first antenna tuning circuit is adapted to provide at least an approximate impedance match to the first RF switch at the first center frequency based on the first antenna match tuning signal.

2. The RF front end circuitry of claim 1 wherein the first center frequency is tuned to a desired first center frequency using the first degeneration tuning signal.

3. The RF front end circuitry of claim 1 wherein there is no surface acoustic wave filter in a receive path between the first active tunable low-noise RF bandpass filter and down conversion circuitry and there is no bulk acoustic wave filter in the receive path between the first active tunable low-noise RF bandpass filter and the down conversion circuitry.

4. The RF front end circuitry of claim 1 wherein there is no surface acoustic wave filter in a receive path between the first active tunable low-noise RF bandpass filter and an antenna and there is no bulk acoustic wave filter in the receive path between the first active tunable low-noise RF bandpass filter and the antenna.

5. The RF front end circuitry of claim 1 wherein during operation of the first active tunable low-noise RF bandpass filter, the first active tunable low-noise RF bandpass filter has at least six decibels of gain at the first center frequency and less than or equal to a negative six decibels of gain at the first frequency outside of the first passband.

6. The RF front end circuitry of claim 1 wherein during operation of the first active tunable low-noise RF bandpass filter, a one decibel out of band input compression point (IP1dB) of the first active tunable low-noise RF bandpass filter at the first frequency outside of the first passband is greater than or equal to about zero decibel milliwatts.

7. The RF front end circuitry of claim 1 wherein during operation of the first active tunable low-noise RF bandpass filter, the tunable frequency selective degeneration circuit presents an inductive impedance to the first non-inverting output over at least one-half of the first passband.

8. The RF front end circuitry of claim 1 wherein during operation of the first active tunable low-noise RF bandpass filter, an impedance response of the tunable frequency selective degeneration circuit is asymmetrical, such that a bandpass filter response of the first active tunable low-noise RF bandpass filter provides a first low-side notch having a first low-side notch frequency based on the first degeneration tuning signal.

9. The RF front end circuitry of claim 8 wherein a first RF interference signal has a first interference frequency, and during operation of the first active tunable low-noise RF bandpass filter, the first active tunable low-noise RF bandpass filter is tuned using the first degeneration tuning signal, such that the first low-side notch frequency is about equal to the first interference frequency.

10. The RF front end circuitry of claim 1 wherein:
the first active tunable low-noise RF bandpass filter further comprises a tunable load circuit coupled to a first inverting output of the first transistor element;
during operation of the first active tunable low-noise RF bandpass filter, a bandpass frequency response of the tunable load circuit is based on a first load tuning signal;
during operation of the first active tunable low-noise RF bandpass filter, a bandpass filter response of the first active tunable low-noise RF bandpass filter is based on the bandpass frequency response of the tunable load circuit and an impedance response of the tunable frequency selective degeneration circuit;
during operation of the first active tunable low-noise RF bandpass filter, the first center frequency is further based on the first load tuning signal;
the control circuitry is further adapted to provide the first load tuning signal; and
the tunable load circuit is adapted to provide a first RF output signal based on the amplifying and filtering of the first RF input signal.

11. The RF front end circuitry of claim 10 wherein the tunable load circuit has a single-ended output adapted to provide the first RF output signal.

12. The RF front end circuitry of claim 10 wherein the tunable load circuit has a differential output adapted to provide the first RF output signal.

13. The RF front end circuitry of claim 10 wherein during operation of the first active tunable low-noise RF bandpass filter, the impedance response of the tunable frequency selective degeneration circuit is asymmetrical, such that the bandpass filter response of the first active tunable low-noise RF bandpass filter provides a first low-side notch having a first low-side notch frequency based on the first degeneration tuning signal.

14. The RF front end circuitry of claim 13 wherein a first RF interference signal has a first interference frequency, and during operation of the first active tunable low-noise RF bandpass filter, the first active tunable low-noise RF bandpass filter is tuned using the first degeneration tuning signal, such that the first low-side notch frequency is about equal to the first interference frequency, and the first active tunable low-noise RF bandpass filter is further tuned using the first load tuning signal, such that a frequency of a peak in the bandpass filter response is about equal to a desired first center frequency.

15. The RF front end circuitry of claim 14 wherein:
the first active tunable low-noise RF bandpass filter further comprises a high-side notch filter circuit coupled to the first inverting output of the first transistor element;
during operation of the first active tunable low-noise RF bandpass filter, a high-side notch frequency response of the high-side notch filter circuit is based on a second load tuning signal;
during operation of the first active tunable low-noise RF bandpass filter, a high-side notch filter response of the first active tunable low-noise RF bandpass filter is based on the high-side notch frequency response of the high-side notch filter circuit;
during operation of the first active tunable low-noise RF bandpass filter, a high-side notch frequency is based on the second load tuning signal; and
the control circuitry is further adapted to provide the second load tuning signal.

16. The RF front end circuitry of claim 15 wherein a second RF interference signal has a second interference frequency, and during operation of the first active tunable low-noise RF bandpass filter, the first active tunable low-noise RF bandpass filter is further tuned using the second load tuning signal, such that the high-side notch frequency is about equal to the second interference frequency.

17. The RF front end circuitry of claim 10 wherein:
the first active tunable low-noise RF bandpass filter further comprises a high-side notch filter circuit coupled to the first inverting output of the first transistor element;
during operation of the first active tunable low-noise RF bandpass filter, a high-side notch frequency response of the high-side notch filter circuit is based on a second load tuning signal;
during operation of the first active tunable low-noise RF bandpass filter, a high-side notch filter response of the first active tunable low-noise RF bandpass filter is based on the high-side notch frequency response of the high-side notch filter circuit;
during operation of the first active tunable low-noise RF bandpass filter, a high-side notch frequency is based on the second load tuning signal; and
the control circuitry is further adapted to provide the second load tuning signal.

18. The RF front end circuitry of claim 1 further comprising a second active tunable low-noise RF bandpass filter, such that
the first active tunable low-noise RF bandpass filter is adapted to provide a first RF output signal based on the amplifying and filtering of the first RF input signal and a bandpass response of the first active tunable low-noise RF bandpass filter; and
the second active tunable low-noise RF bandpass filter is adapted to receive, amplify, and filter a second RF input signal to provide a second RF output signal based on a bandpass response of the second active tunable low-noise RF bandpass filter.

19. The RF front end circuitry of claim 18 wherein the RF front end circuitry is multi-band RF front end circuitry and the first active tunable low-noise RF bandpass filter is a highband RF bandpass filter and the second active tunable low-noise RF bandpass filter is a lowband RF bandpass filter.

20. The RF front end circuitry of claim 19 further comprising a multiplexer adapted to receive the first RF output signal and the second RF output signal and provide a multiplexed RF output signal based on a selected one of the first RF output signal and the second RF output signal.

21. The RF front end circuitry of claim 1 wherein the first active tunable low-noise RF bandpass filter further comprises a second transistor element, such that:
   the first transistor element has a first inverting output;
   the first transistor element has a first input adapted to receive the first RF input signal;
   the second transistor element has a second non-inverting output coupled to the first inverting output;
   the first transistor element and the second transistor element form a cascode amplifier; and
   a first RF output signal is based on the amplifying and filtering of the first RF input signal using the cascode amplifier.

22. The RF front end circuitry of claim 21 wherein:
   the first active tunable low-noise RF bandpass filter further comprises a cascode high-side notch filter circuit coupled to the first inverting output;
   during operation of the first active tunable low-noise RF bandpass filter, a cascode high-side notch frequency response having a cascode high-side notch frequency of the cascode high-side notch filter circuit is based on a notch tuning signal;
   during operation of the first active tunable low-noise RF bandpass filter, a high-side notch filter response of the first active tunable low-noise RF bandpass filter is based on the cascode high-side notch frequency response of the cascode high-side notch filter circuit;
   during operation of the first active tunable low-noise RF bandpass filter, the cascode high-side notch frequency is based on the notch tuning signal; and
   the control circuitry is further adapted to provide the notch tuning signal.

23. The RF front end circuitry of claim 21 wherein:
   the first active tunable low-noise RF bandpass filter further comprises a cascode low-side notch filter circuit coupled to the first inverting output;
   during operation of the first active tunable low-noise RF bandpass filter, a cascode low-side notch frequency response having a cascode low-side notch frequency of the cascode low-side notch filter circuit is based on a notch tuning signal;
   during operation of the first active tunable low-noise RF bandpass filter, a low-side notch filter response of the first active tunable low-noise RF bandpass filter is based on the cascode low-side notch frequency response of the cascode low-side notch filter circuit;
   during operation of the first active tunable low-noise RF bandpass filter, the cascode low-side notch frequency is based on the notch tuning signal; and
   the control circuitry is further adapted to provide the notch tuning signal.

24. The RF front end circuitry of claim 21 wherein:
   the first transistor element is a first field effect transistor (FET) element;
   the first non-inverting output is a first source;
   the first inverting output is a first drain;
   the first input is a first gate;
   the second transistor element is a second FET element; and
   the second non-inverting output is a second source.

25. The RF front end circuitry of claim 21 wherein:
   the first transistor element is a first bipolar transistor element;
   the first non-inverting output is a first emitter;
   the first inverting output is a first collector;
   the first input is a first base;
   the second transistor element is a second bipolar transistor element; and
   the second non-inverting output is a second emitter.

26. The RF front end circuit of claim 1 wherein:
   the tunable frequency selective degeneration circuit is adapted to provide series feedback to the first transistor element;
   gain of the first active tunable low-noise RF bandpass filter is based on the series feedback;
   at the first frequency outside of the first passband, the series feedback has a first magnitude;
   at the first center frequency, the series feedback has a second magnitude, which is less than the first magnitude;
   at the first frequency outside of the first passband, the first active tunable low-noise RF bandpass filter has a first linearity; and
   at the first center frequency, the first active tunable low-noise RF bandpass filter has a second linearity, which is less than or equal to the first linearity.

27. A method comprising:
   providing a first active tunable low-noise RF bandpass filter, which comprises a tunable frequency selective degeneration circuit coupled to a first non-inverting output of a first transistor element;
   receiving a first RF input signal;
   providing a first degeneration tuning signal; and
   amplifying and filtering the first RF input signal using the first active tunable low-noise RF bandpass filter, such that:
      the first active tunable low-noise RF bandpass filter has a first passband;
      a first center frequency of the first passband is based on the first degeneration tuning signal;
      at the first center frequency, the tunable frequency selective degeneration circuit presents a first impedance to the first non-inverting output based on the first degeneration tuning signal;
      at a first frequency outside of the first passband, the tunable frequency selective degeneration circuit presents a second impedance to the first non-inverting output based on the first degeneration tuning signal; and
      the second impedance is greater than the first impedance,
   wherein at the first center frequency, the first active tunable low-noise RF bandpass filter has a first gain and at the first frequency, the first active tunable low-noise RF bandpass filter has a second gain, which is less than the first gain; and
   coupling a first antenna tuning circuit between the first active tunable low-noise RF bandpass filter and a first RF switch, such that, during operation of the first active tunable low-noise RF bandpass filter provides a first antenna match tuning signal, and the first antenna tuning circuit provides at least an approximate impedance match to the first RF switch at the first center frequency based on the first antenna match tuning signal.

* * * * *